(12) United States Patent
Kim

(10) Patent No.: US 9,524,921 B2
(45) Date of Patent: Dec. 20, 2016

(54) SEMICONDUCTOR DEVICE AND METHOD FOR FABRICATING THE SAME

(71) Applicant: Samsung Electronics Co., Ltd., Suwon-si (KR)

(72) Inventor: Tae-Seong Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 270 days.

(21) Appl. No.: 14/146,741

(22) Filed: Jan. 3, 2014

(65) Prior Publication Data

US 2014/0191414 A1    Jul. 10, 2014

(30) Foreign Application Priority Data

Jan. 9, 2013  (KR) .................. 10-2013-0002550

(51) Int. Cl.
*H01L 23/48* (2006.01)
*H01L 23/52* (2006.01)
*H01L 29/40* (2006.01)
*H01L 21/768* (2006.01)

(52) U.S. Cl.
CPC ....... *H01L 23/481* (2013.01); *H01L 21/76898* (2013.01); *H01L 2224/73204* (2013.01); *H01L 2924/15311* (2013.01)

(58) Field of Classification Search
CPC .................. H01L 23/481; H01L 21/76898

USPC ................. 257/774, 752, 698, 701
See application file for complete search history.

(56) References Cited

U.S. PATENT DOCUMENTS

| | | | |
|---|---|---|---|
| 8,129,277 B2 | 3/2012 | Kimura et al. | |
| 8,158,489 B2 | 4/2012 | Huang et al. | |
| 2009/0321948 A1 | 12/2009 | Wang et al. | |
| 2010/0178766 A1 | 7/2010 | Andry et al. | |
| 2011/0133333 A1* | 6/2011 | Kwon | H01L 21/76898 257/737 |
| 2014/0151895 A1* | 6/2014 | West | H01L 21/76898 257/774 |

FOREIGN PATENT DOCUMENTS

| | | |
|---|---|---|
| JP | 2002-170904 | 6/2002 |
| JP | 2007-311385 | 11/2007 |
| JP | 2011-082470 | 4/2011 |
| KR | 1020110078592 A | 7/2011 |

* cited by examiner

Primary Examiner — Thien F Tran
(74) Attorney, Agent, or Firm — Myers Bigel, P.A.

(57) ABSTRACT

A semiconductor device and a method for fabricating the same are provided. The semiconductor device comprising a substrate including a first surface and a second surface that face each other, a planarization layer formed on the first surface of the substrate, a passivation layer formed on the planarization layer, and a through via contact penetrating the substrate, the planarization layer, and the passivation layer, and being exposed from the passivation layer.

19 Claims, 9 Drawing Sheets

SEMICONDUCTOR DEVICE AND METHOD FOR FABRICATING THE SAME

CROSS-REFERENCE TO RELATED APPLICATION

This application is based on and claims priority under 35 U.S.C. §119 from Korean Patent Application No. 10-2013-0002550, filed on Jan. 9, 2013 in the Korean Intellectual Property Office, the disclosure of which is incorporated herein in its entirety by reference.

BACKGROUND

The present invention relates to a semiconductor device and a method for fabricating the same.

Three-dimensional (3D) packaging technologies for stacking individual semiconductor chips have recently been developed. Among them, through silicon via contact technology, which substitutes for existing wire bonding technology, is a packaging technology in which a via-hole is formed to penetrate a substrate and an electrode is formed in the via-hole.

Since semiconductor chips are being made thinner and since more than several thousands of through silicon via contacts may be formed in a single chip, problems have arisen that may affect the reliability of the semiconductor chips due to the through silicon via contacts.

SUMMARY

The present invention provides semiconductor devices which may have improved yields and/or improved reliability in wafer crack prevention and chip-level backside processes through simultaneous use of a stress buffer layer and a passivation layer on a surface from which through via contacts are exposed.

Methods of fabricating such semiconductor devices are also provided.

Additional advantages, subjects, and features of the invention will be set forth in part in the description which follows and in part will become apparent to those having ordinary skill in the art upon examination of the following or may be learned from practice of the invention.

In one aspect of the present invention, there is provided a semiconductor device comprising a substrate including a first surface and a second surface that are opposite each other, a planarization layer on the first surface of the substrate, a passivation layer on the planarization layer, and a through via contact penetrating the substrate, the planarization layer, and the passivation layer, an end of the through via contact being exposed through an opening in the passivation layer.

In another aspect of the present invention, there is provided a semiconductor device comprising a substrate including a first surface and a second surface that are opposite each other, an isolation pattern on the first surface of the substrate, a circuit pattern on the first surface of the substrate, a pre-metal dielectric layer on the first surface of the substrate that at least partly covers the circuit pattern, a through-hole penetrating the pre-metal dielectric layer, the substrate and the isolation pattern, a through via contact in the through-hole, wherein a portion of the through via contact projects from the second surface of the substrate, a dielectric spacer layer between the substrate and the through via contact, a planarization layer on the dielectric spacer layer and the second surface of the substrate, the planarization layer including an opening that exposes the through via contact, and a passivation layer on the planarization layer the passivation layer including an opening that exposes the through via contact.

Pursuant to further aspects of the present invention, semiconductor devices are provided that include a substrate having a first major surface and a second major surface opposite the first surface; a plurality of through-holes that each extend through the substrate from the first major surface to the second major surface; a plurality of through via contacts that are positioned in respective ones of the plurality of through-holes, wherein a first end of each through via contact projects from the second major surface of the substrate; a planarization layer on the second major surface of the substrate; and a passivation layer on the planarization layer opposite the substrate, the passivation layer being coplanar with the first end of each through via contact.

DETAILED DESCRIPTION OF THE EMBODIMENTS

The present invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification unless clearly indicated otherwise. In the attached figures, the thickness of layers and regions may be exaggerated for clarity.

It will be understood that when a first element or layer is referred to as being "connected to," "coupled to," or "on" a second element or layer, it can be directly connected to, coupled to or on the second element or layer or intervening elements or layers may be present. In contrast, when a first element is referred to as being "directly connected to,"

"directly coupled to" or "directly on" a second element or layer, there are no intervening elements or layers present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

The use of the terms "a" and "an" and "the" and similar referents in the context of describing the invention are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better describe the invention and is not a limitation on the scope of the invention unless otherwise specified.

Hereinafter, a semiconductor device according to an embodiment of the present invention will be described with reference to FIGS. 1 to 5.

Figure 1:
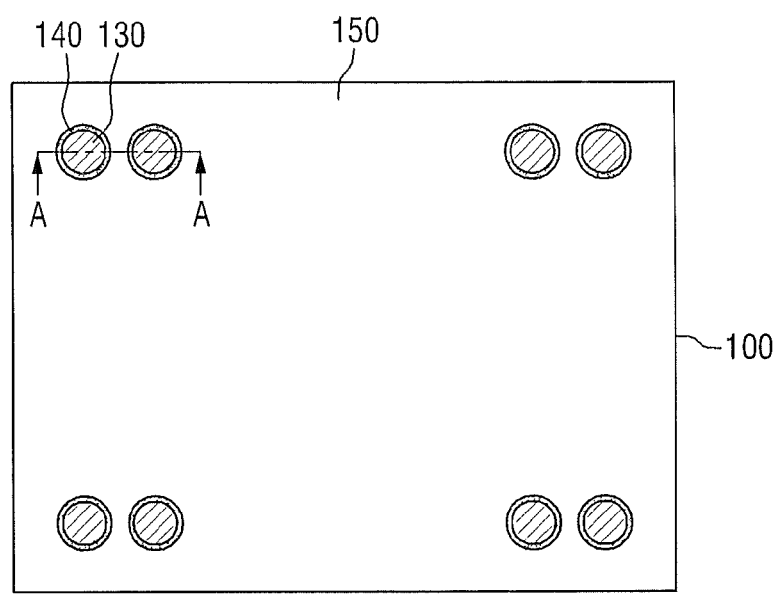
FIG. 1 is a plan view illustrating a portion of a semiconductor device according to an embodiment of the present invention.
Figure 2:
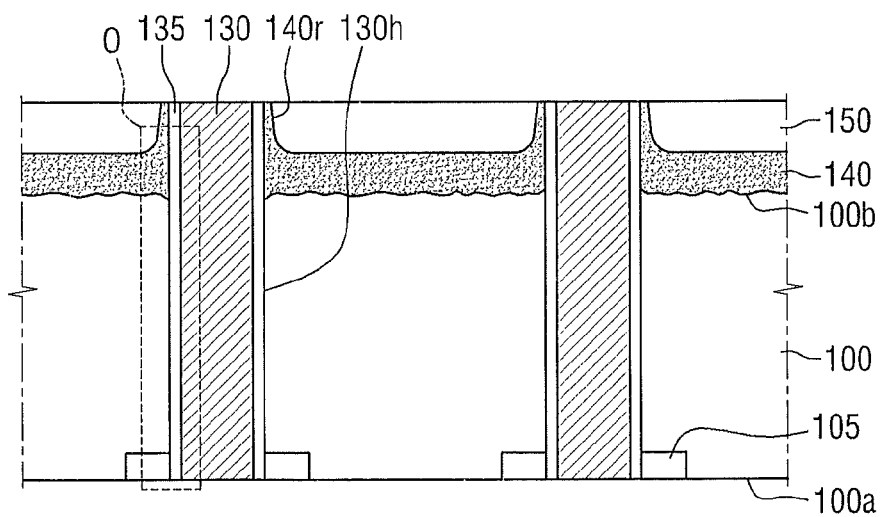
FIG. 2 is a cross-sectional view taken along line A-A in FIG. 1.
Figure 3:
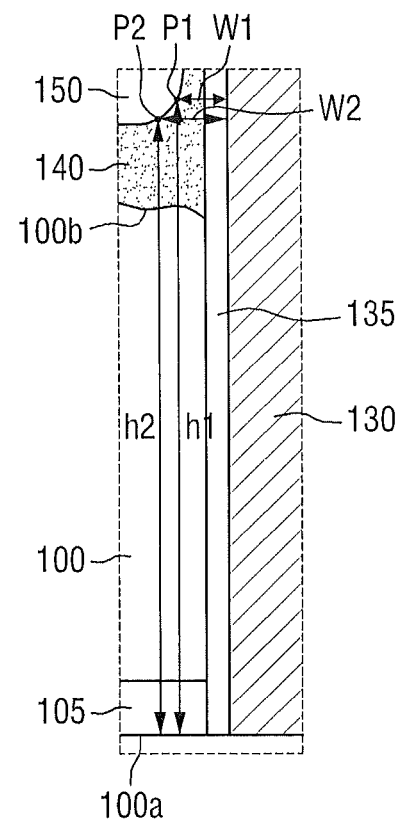
FIG. 3 is an enlarged view of a portion 0 of FIG. 2.
Figure 4:
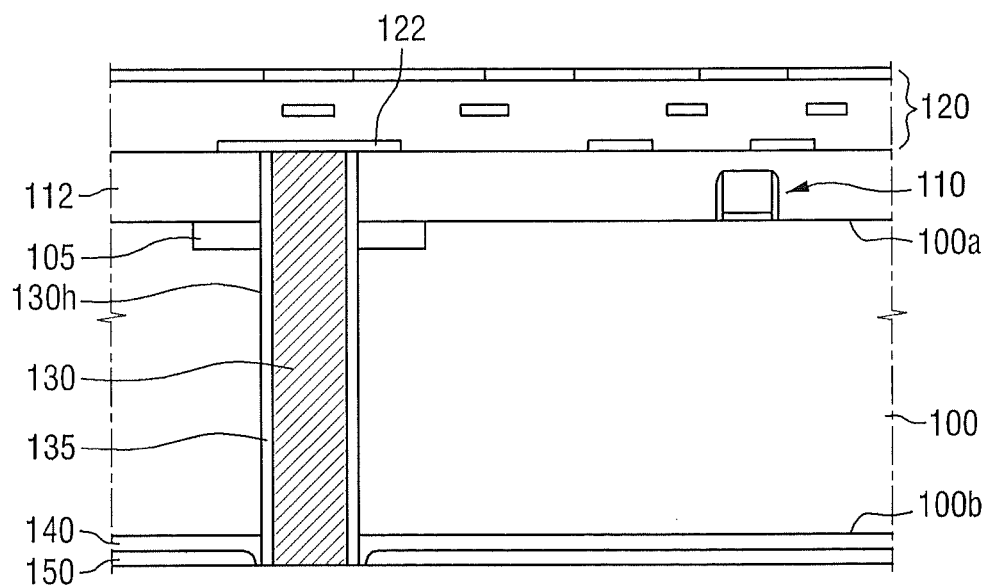
FIG. 4 is a cross-sectional view of a portion of a semiconductor device that includes one of the through via contacts of FIG. 2.
Figure 5:
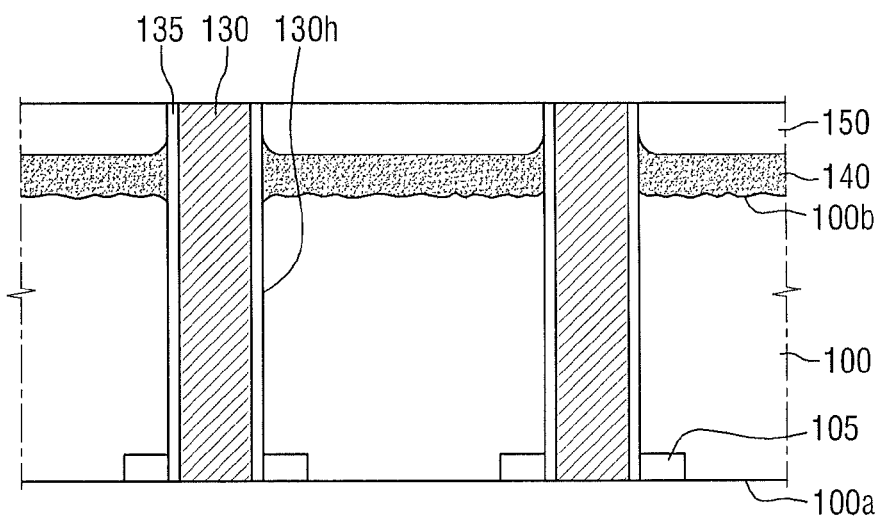
FIG. 5 is a cross-sectional view illustrating a modified example of a semiconductor device according to an embodiment of the present invention.

FIG. 1 is a plan view illustrating a portion of a semiconductor device according to an embodiment of the present invention. FIG. 2 is a cross-sectional view taken along line A-A of FIG. 1. FIG. 3 is an enlarged view of a portion 0 of FIG. 2. FIG. 4 is a cross-sectional view of a semiconductor device that includes one of the through via contacts of FIG. 2. FIG. 5 is a cross-sectional view illustrating a modified example of a semiconductor device according to an embodiment of the present invention.

Referring to FIG. 1, a semiconductor device 1 may include a substrate 100, a through via contact 130, a planarization layer 140, and a passivation layer 150.

The substrate 100 may be, for example, a wafer, or a chip that is obtained by dividing a wafer into a plurality of chips. If the substrate 100 is a substrate in the unit of a divided chip, the substrate 100 may be, for example, a memory chip, a logic chip, or the like. If the substrate 100 is a logic chip, it may be designed based on the operations that the logic chip is to perform. If the substrate 100 is a memory chip, the memory chip may be, for example, a nonvolatile memory chip. In some embodiments, the memory chip may be a flash memory chip such as, for example, a NAND flash memory chip or a NOR flash memory chip. However, the memory devices according to embodiments of the present invention is not limited thereto. In some embodiments of the present invention, the memory chip may include any one of a PRAM (Phase-change Random-Access Memory), a MRAM (Magneto-resistive Random-Access Memory), and a RRAM (Resistive Random-Access Memory). If the substrate 100 is a wafer, it may include a logic element or a memory element that performs the function as described above.

The through via contact 130 may penetrate the substrate 100, and one end of the through via contact 130 may be exposed. In FIG. 1, the through via contacts 130 are provided at corners of the substrate 100, but embodiments of the inventive concept are not limited thereto. Although not illustrated to simplify the drawing, the through via contacts 130 may each have an associated dielectric spacer layer (135 in FIG. 2).

The planarization layer 140 is formed on the surface of the substrate 100 through which the through via contact 130 is exposed. The planarization layer 140 may surround the circumference of the through via contact 130 (and any dielectric spacer layer 135 that surrounds the through via contact 130), but is not limited thereto. In some embodiments, the planarization layer 140 may not be exposed to an outside depending on materials included in the planarization layer 140.

The passivation layer 150 may also be formed on the surface of the substrate 100 through which the through via contact 130 is exposed. The passivation layer 150 may be formed on the planarization layer 140 and may cover the planarization film 140. If the planarization 140 is not formed in the circumference of the through via contact 130, the passivation layer 140 may be formed in the circumference of the through via contact 130 to expose the through via contact 130. The through via contact 130 that is exposed from the passivation layer 150 may have in an island shape.

The through via contact 130, the planarization layer 140, and the passivation layer 150 will be described in detail with respect to FIGS. 2 and 3.

For convenience of explanation, FIG. 2 illustrates only the through via contact 130, the planarization layer 140, and the passivation layer 150. The overall cross section of the semiconductor device 1 will be described with reference to FIG. 4.

Referring to FIG. 2, the semiconductor device 1 includes the substrate 100, the planarization layer 140, the passivation layer 150, and the through via contacts 130. The semiconductor device 1 may further include dielectric spacer layers 135 that are interposed between the substrate 100 and the through via contacts 130.

The substrate 100 may have a first surface 100a and a second surface 100b. The first surface 100a and the second surface 100b may be opposite each other, and may be, for example, a top surface 100a and a bottom surface 100b of the substrate 100 (when viewed in this manner the substrate 100 is pictured upside down in FIG. 2). The substrate 100 may be, for example, a silicon substrate. The substrate 100 may include a different material such as, for example, silicon germanium, indium antimonide, lead telluride, indium arsenide, indium phosphide, gallium arsenide, or gallium antimonide. In some embodiments, the first surface 100a of the substrate 100 may be planar, while the second surface 100b of the substrate 100 may be uneven. However, the first and second surfaces 100a, 100b are not limited thereto. For example, in other embodiments, the second surface 100b of the substrate 100 may be formed by a manufacturing technique that does not result in an uneven surface. The description below will focus on an embodiment of the present invention that has a substrate 100 having an uneven second surface 100b.

The substrate 100 may include an isolation pattern 105 formed in the substrate 100. The isolation pattern 105 may be formed, for example, at the first surface 100a of the substrate 100a. The isolation pattern 105 may comprise, for example, a STI (Shallow Trench Isolation) structure. An upper surface of the isolation pattern 105 may be on the same plane as the first surface 100a of the substrate, but embodiments of the present invention are not limited thereto. The isolation pattern 105 may be formed of a dielectric material such as, for example, a silicon oxide layer. In other example embodiments the isolation pattern

105 may be formed by ozone-TEOS (Tetra Ortho Silicate Glass), APCVD (Atmospheric Pressure Chemical Vapor Deposition), PECVD (Plasma Enhanced Chemical Vapor Deposition), or HDP CVD (High Density Plasma Chemical Vapor Deposition).

The planarization layer 140 may be formed on the second surface 100b of the substrate 100. A bottom surface of the planarization layer 140 may be planar except for a portion of the planarization layer 140 that surrounds the through via contact 130. In other embodiments, the bottom surface of the planarization layer 140 may be entirely planar. The planarization layer 140 may be made of for example, resin, and specifically, low viscosity resin. The low viscosity resin may be, for example, polyimide (PI), photosensitive polyimide (PSPI), photoresist (PR), polystyrene, or benzocyclobutene (BCB), but is not limited thereto. That is, in so far as a material has low viscosity and high liquidity, fills a gap well, and insulates electricity, the low viscosity resin is not limited. The viscosity of the planarization layer 140 which may be made of low viscosity resin may be, for example, 100 to 1000 centipoises (CPS).

The planarization layer 140 may be a stress buffer layer which uniformly covers the uneven second surface 100b of the substrate and distributes stress that is applied to the second surface 100b of the substrate. The planarization layer 140 can ease the flexing of the semiconductor device, and remove or reduce the possibility that cracks occur on the second surface 100b of the substrate 100.

The passivation layer 150 may be formed on the planarization layer 140. The bottom surface of the passivation layer 150 (i.e., the surface opposite the planarization layer 140) may be a planar surface. The passivation layer 150 may include, for example, at least one of silicon oxide and silicon nitride, and specifically, may include at least one of SiN, SiO2, SiON, SiCN, SiOCN, and TEOS (Tetra Ethyl Ortho Silicate). Although the passivation layer 150 is illustrated as a single layer, it is not limited thereto, but instead may include a plurality of layers.

The through via contact 130 may penetrate the substrate 100, the planarization layer 140, and the passivation layer 150. The through via contact 130 may be exposed through the planarization layer 140 and the passivation layer 150. If the passivation layer 150 entirely covers the planarization layer 140, the through via contact 130 may be exposed through the passivation layer 150. A first end of the through via contact 130 is formed to project from the substrate 100. The projecting first end of the through via contact 130 is surrounded by the planarization layer 140 and the passivation layer 150. Although the second end of the through via contact 130 is illustrated as being co-planar with the first surface 100a of the substrate in FIG. 2, it will be understood that in other embodiments the second end of the through via contact 130 may project from the first surface 100a of the substrate 100.

The through via contact 130 may be formed in a through-hole 130h that penetrates the first surface 100a and the second surface 100b of substrate 100. The through-hole 130h penetrates the isolation pattern 105 that is formed in the first surface 100a of the substrate 100 and the through-hole 130h extends up to and through the second surface 100b of the substrate 100. Accordingly, the through via contact 130 is formed to penetrate the isolation pattern 105 that is included in the substrate 100. It is illustrated that a side wall of the through-hole 130h vertically penetrates the isolation pattern 105 and the substrate 100, but embodiments of the inventive concept are not limited thereto. That is, the side wall of the through-hole 130h may be inclined. The through via contact 130 may include, for example, copper (Cu), aluminum (Al), or tungsten (W). In some embodiments of the present invention, the through via contact 130 may be made of low resistance copper.

The dielectric spacer layer 135 may be formed between the through via contact 130 and the substrate 100. Specifically, the dielectric spacer layer 135 may be formed along the side wall of the through-hole 130h. The dielectric spacer layer 135 may insulate the substrate 100 from the through via contact 130, and vice versa. The dielectric spacer layer 135 may be formed, for example, using silicon oxide or carbon-doped silicon oxide having low-k. In some embodiments, the dielectric spacer layer 135 may be formed using a TEOS film, an ozone TEOS film, or a USG film, which has superior step coverage characteristics.

The dielectric spacer layer 135 may penetrate the substrate 100, the planarization layer 140, and the passivation layer 150, together with the through via contact 130. The dielectric spacer layer 135 is exposed through the passivation layer 150 and the planarization layer 140. The exposed upper surfaces of the dielectric spacer layer 135 and the through via contact 130 may be co-planar with the bottom surface of the passivation layer 150. In the same manner as the through via contact 130, part of the dielectric spacer layer 135 may project from the second surface 100b of the substrate, and the projecting dielectric spacer layer 135 is surrounded by the planarization layer 140 and the passivation layer 150.

A barrier layer (not illustrated) may be interposed between the dielectric spacer layer 135 and the through via contact 130. The barrier layer may include, for example, a material of Ta, TaN, Ti, TiN, Ru, Co, Ni, NiB, or WN. The barrier layer may be a single layer or a stacked body of two or more layers.

Referring to FIGS. 2 and 3, the bottom surface of the planarization layer 140 may project along the circumference of the through via contact 130 in a direction that extends away from the first surface 100a of the substrate 100. In other words, the bottom surface of the planarization layer 140 includes a first point P1 that is close to the through via contact 130 and a second point P2 that is farther away from the through via contact 130 than is the first point P1. If it is assumed that a distance from the through via contact 130 to the first point P1 is W1 and a distance from the through via contact 130 to the second point P2 is W2, W1 is shorter than W2. A height from the first point P1 to the first surface 100a of the substrate is a first height h1, and a height from the second point P2 to the first surface 100a of the substrate is a second height h2. The first height h1 of the first point P1 is different from the second height h2 of the second point P2. According to an embodiment of the present invention, it is described that the first height h1 of the first point P1 is greater than the second height h2 of the second point P2.

In the embodiment of FIGS. 2 and 3, the first end of the through via contact 130 that projects from the second surface 100b of the substrate 100 is entirely surrounded by the planarization layer 140. In other words, the projecting first end of through via contact 130 is surrounded by the planarization layer 140 and the passivation layer 150. The planarization layer 140 entirely surrounds the projecting first end of through via contact 130, and the passivation layer 150 surrounds only a part of the projecting first end of the through via contact 130. In an embodiment of the present invention, since the dielectric spacer layer 135 is interposed between the through via contact 130 and the substrate 100, the planarization layer 140 is formed to be in contact with the portion of the dielectric spacer layer 135 that projects from the second surface 100b of the substrate 100. However, the passivation layer 150 is not in direct contact with the projecting dielectric spacer layer 135, but is in contact with the dielectric spacer layer 135 through the medium of the planarization layer 140.

On the side wall of the first end of the through via contact 130 that projects from the second surface 100b of the substrate, the dielectric spacer layer 135, the planarization layer 140, and the passivation layer 150 may be sequentially formed.

In the semiconductor device according to an embodiment of the present invention, the planarization layer 140 may include a recess that is between portions 140r of the planarization layer that are curved in the direction of the first surface 100a of the substrate. The passivation layer 150 may fill the recess in the planarization layer 140.

The planarization layer 140 may project along the circumference of the through via contact 130 because the material included in the planarization layer 140 may be a low viscosity resin. Further, since an adsorption force acts between the low viscosity resin that may be included in the planarization layer 140 and the dielectric spacer layer 135, the planarization layer 140 may project from the circumference of the through via contact 130.

The width of the planarization layer 140 that is coplanar with the first end of the through via contact 130, that is, the width of the planarization layer 140 in FIG. 1, may be changed depending on the viscosity of the low viscosity resin included in the planarization layer 140.

Referring to FIG. 4, a circuit pattern 110 is formed on the first surface 100a of the substrate 100. The circuit pattern 110 may include, for example, a transistor, a diode, or a capacitor. The circuit patterns 110 may constitute circuit elements and, for example, may constitute a logic circuit element or a memory element.

A pre-metal dielectric layer (PMD) 112 is formed on the first surface 100a of the substrate 100 to cover the circuit pattern 110 formed on the second surface 100a. The pre-metal dielectric layer 112 may be made of a low-k material such as, for example, FOX, TOSZ, USG, BSG, PSG, BPSG, PRTEOS, FSG, HDP, PEOX, FCVD, or a combination thereof.

A metal wiring layer 120 is formed on the pre-metal dielectric layer 112. The metal wiring layer 120 may include metal wirings that send/receive electrical signals to/from the through via contact 130 and the circuit pattern 110, and an interlayer dielectric layer that electrically insulates the metal wirings from one another. The metal wirings may include a lowermost metal wiring 122 that is formed just above the pre-metal dielectric layer 112.

The through-hole 130h may penetrate the pre-metal dielectric layer 112, the isolation pattern 105, and the substrate 100, and may extend down to the second surface 100b of the substrate 100. The through via contact 130 that is formed in the through-hole 130h may also penetrate the pre-metal dielectric layer 112. The through via contact 130 that penetrates the pre-metal dielectric layer 112 may be connected to a part of the lowermost metal wiring 122. However, the through via contact 130 may be formed so that it does not penetrate the metal wiring layer 120.

According to an embodiment of the present invention, the metal wiring layer 120 may exclude a conductive wiring, for example, a redistribution line, which is formed in a process for forming a package.

In some embodiments, the circuit pattern 110 may be a logic circuit pattern, that is, the semiconductor device according to the present invention includes a logic circuit element. In the logic circuit element, the thickness of the circuit pattern 110 may be thicker than the thickness of the metal wiring layer 120 that sends/receives an electrical signal to/from the circuit pattern 110. In such embodiments of the present invention, the ratio of the thickness of the metal wiring layer 120 to the thickness of the through via contact 130 may be, for example, about 1:5 to about 1:10.

In some embodiments, the circuit pattern 110 may be a memory circuit pattern, that is, the semiconductor device according to the present invention includes a memory element. In the memory element, the thickness of the circuit pattern 110 may be thicker than the thickness of the metal wiring layer 120 that sends/receives an electrical signal to/from the circuit pattern 110. In such embodiments of the present invention, the ratio of the thickness of the metal wiring layer 120 to the thickness of the through via contact 130 may be, for example, about 1:10 to about 1:20.

Referring to FIG. 5, a modified example of the semiconductor device illustrated in FIG. 2 will be described. The modified example of the semiconductor device is substantially the same as the semiconductor device illustrated in FIG. 2 except for the positional relationship of the through via contact 130, the planarization layer 140, and the passivation layer 150.

Referring to FIG. 5, a first end of the through via contact 130, along with a portion of the dielectric spacer layer 135, project downwardly from the second surface 100b of the substrate 100 (note that the device is pictured upside down in FIG. 5). The through via contact 130 and the dielectric spacer layer 135 are exposed through the passivation layer 150. However, the planarization layer 140 is entirely covered by the passivation layer 150 and hence is not exposed.

The projecting first end of the through via contact 130 and the projecting portion of the dielectric spacer layer 135 are surrounded by the planarization layer 140 and the passivation layer 150. The planarization layer 140 surrounds projecting portions of the dielectric spacer layer 135 and the through via contact 130 that are near the second surface 100b of the substrate 100. The passivation layer 150 surrounds portions of the dielectric spacer layer 135 and the through via contact 130 that are further from the second surface 100b of the substrate 100. The planarization layer 140 may be in direct contact with a portion of the dielectric spacer layer 135 that projects from the second surface 100b of the substrate 100 and the passivation layer 150 may also be in direct contact with a portion of dielectric spacer layer 135 that projects from the second surface 100b of the substrate 100.

In the embodiment of FIG. 5, the planarization layer 140 projects slightly along the circumference of the through via contact 130. However, it will be appreciated that in other embodiments of the present invention the bottom surface of the planarization layer 140 may be entirely even (i.e., the surface of the planarization layer 140 that directly contacts the passivation layer 150 may be a planar surface).

Figure 6:
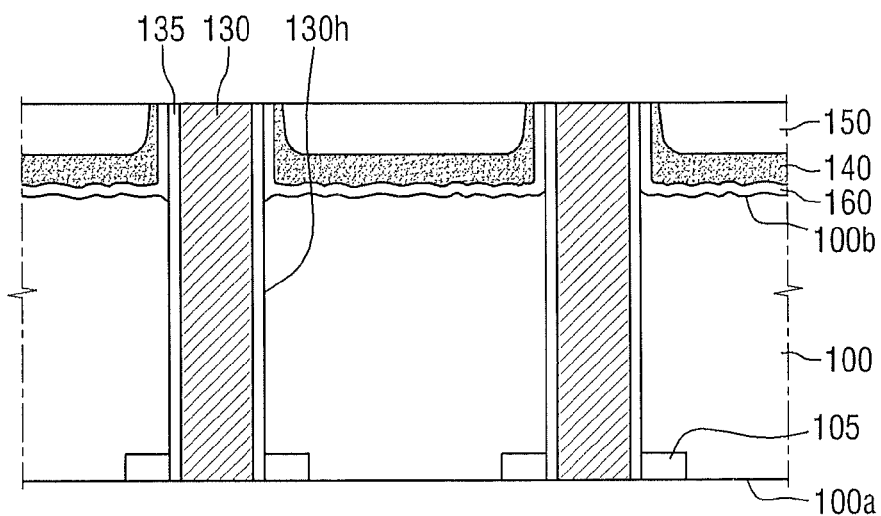
FIG. 6 is a cross-sectional view illustrating a semiconductor device according to another embodiment of the present invention.

Referring to FIG. 6, a semiconductor device according to another embodiment of the present invention will be described. Since this embodiment is substantially the same as the embodiment as described above with respect to FIG. 2, except that an adhesive layer is further provided between the substrate 100 and the through via contact 130, the same reference numerals are used for elements and layers that are included in both the embodiments of FIGS. 2 and 6, and the description thereof will be simplified or omitted.

FIG. 6 is a cross-sectional view illustrating a semiconductor device 2 according to another embodiment of the present invention.

Referring to FIG. 6, the semiconductor device 2 includes a substrate 100, an adhesive layer 160, a planarization layer 140, a passivation layer 150, and a through via contact 130. The semiconductor device 2 may further include a dielectric spacer layer 135 that is interposed between the substrate 100 and the through via contact 130.

The adhesive layer 160 may be interposed between the second surface 100b of the substrate and the planarization layer 140. The adhesive layer 160 may be formed on the second surface 100b of the substrate 100. The adhesive layer 160 may also be formed on the through via contact 130 that projects from the second surface 100b of the substrate.

The adhesive layer 160 may facilitate forming the planarization layer 140 on the second surface 100b of the substrate and the side wall of the projecting first end of the through via contact 130. The adhesive layer 160 may include, for example, at least one of silicon oxide and silicon nitride. Although the adhesive layer 160 is illustrated as a single layer, it will be appreciated that the adhesive layer 160 may include a plurality of layers in some embodiments. In the semiconductor device according to the present invention, the adhesive layer 160 may include at least one of silicon nitride (SiN) and TEOS.

The adhesive layer 160 may be in contact with the portion of the dielectric spacer layer 135 that projects from the second surface 100b. The planarization layer 140 and the passivation layer 150 are sequentially formed on the adhesive layer 160. The dielectric spacer layer 135, the adhesive layer 160, the planarization layer 140, and the passivation layer 150 may be sequentially formed on the side surface of the first end of the through via contact 130 that projects from the second surface 100b of the substrate 100.

Figure 7:
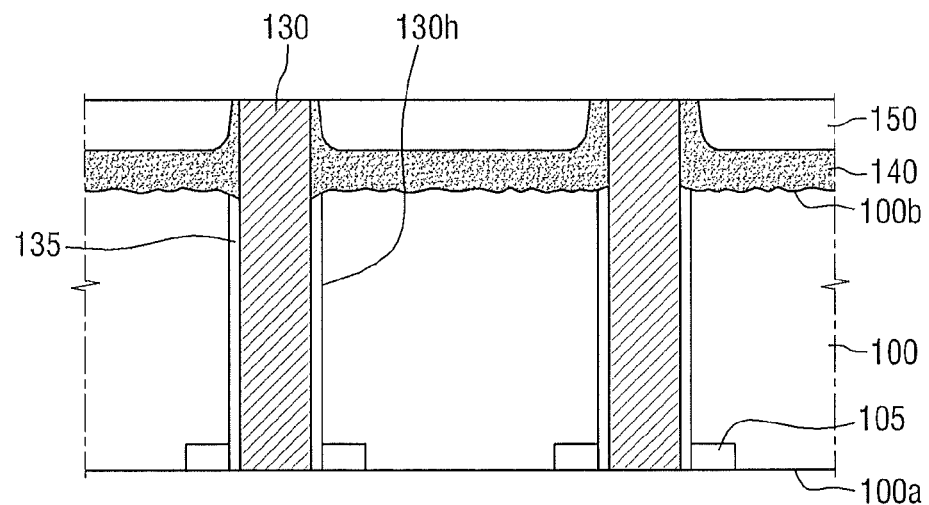
FIG. 7 is a cross-sectional view illustrating a semiconductor device according to still another embodiment of the present invention.

Referring to FIG. 7, a semiconductor device according to another embodiment of the present invention will be described. Since this embodiment is substantially the same as the embodiment as described above with respect to FIG. 2 except that the dielectric spacer layer does not project from the substrate, the same reference numerals are used for elements and layers that are included in both the embodiments of FIGS. 2 and 7, and the description thereof will be simplified or omitted.

FIG. 7 is a cross-sectional view illustrating a semiconductor device 3 according to another embodiment of the present invention.

Referring to FIG. 7, the semiconductor device 3 includes a substrate 100, a planarization layer 140, a passivation layer 150, and a through via contact 130. The semiconductor device 3 further includes a dielectric spacer layer 135

The dielectric spacer layer 135 is interposed between the substrate 100 and the through via contact 130. However, the dielectric spacer layer 135 is not interposed between the through via contact 130 and the planarization layer 140 and passivation layer 150. That is, the dielectric spacer layer 135 extends to the second surface 100b of the substrate 100, but does not project from the second surface 100b of the substrate 100. In other words, the dielectric spacer layer 135 is formed only along the side wall of the through-hole 130h through the substrate 100. Accordingly, the dielectric spacer layer 135 is not exposed through the passivation layer 150 and the planarization layer 140. That is, the planarization layer 140 overlaps and covers the dielectric spacer layer 135.

In the above description of the semiconductor device 3, it is described that the dielectric spacer layer 135 does not project from the second surface 100b of the substrate. However, it will be understood that the present invention includes a case where a part of the dielectric spacer layer 135 projects from the second surface 100b of the substrate, but the dielectric spacer layer 135 is not exposed through the passivation layer 150 and the planarization layer 140 (i.e., the dielectric spacer layer 135 may project beyond the second surface 100b of the substrate 100, but may not project all the way through the planarization layer 140 and/or the passivation layer 150).

The planarization layer 140 is formed on the second surface 100b of the substrate 100 and the dielectric spacer layer 135. The planarization layer 140 is formed to be in contact with the side surface of the through via contact 130 that projects from the second surface 100b. The planarization layer 140 may entirely surround the side surface of the projecting through via contact 130, but is not limited thereto. That is, a lower portion of the projecting through via contact 130 may come in contact with the planarization layer 140, and an upper portion of the projecting through via contact 130 may come in contact with the passivation layer 150.

Figure 8:
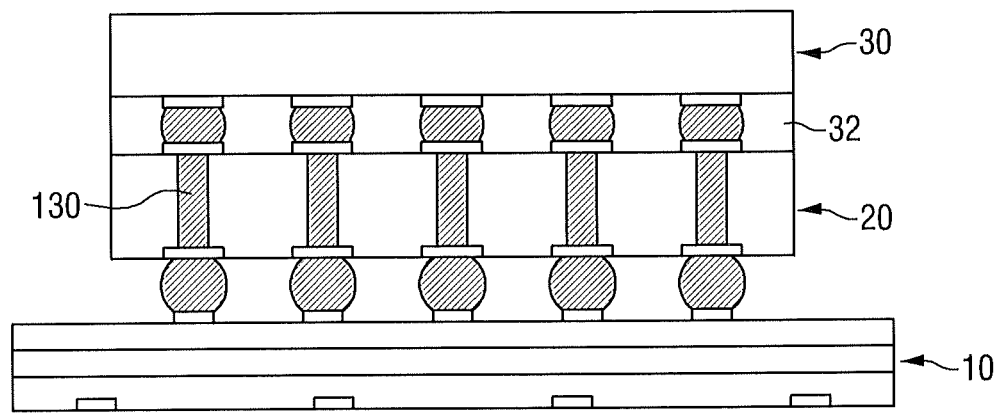
FIG. 8 is a cross-sectional view illustrating a semiconductor package that includes a semiconductor device according to embodiments of the present invention.

FIG. 8 is a cross-sectional view illustrating a semiconductor package that includes a semiconductor device according to embodiments of the present invention.

Referring to FIG. 8, a first semiconductor chip 20 may be arranged on a package substrate 10. The first semiconductor chip 20 may be, for example, one of semiconductor devices 1, 2, and 3 according to an embodiment of the present invention. The first semiconductor chip 20 includes a through via contact 130 that penetrates the first semiconductor chip 20. A second semiconductor chip 30 is arranged on the first semiconductor chip 20. The second semiconductor chip 30 may also be, for example, one of the semiconductor devices 1, 2, and 3 according to an embodiment of the present invention, but is not limited thereto. A bonding layer 32 may be interposed between the first semiconductor chip 20 and the second semiconductor chip 30 to bond the first and second semiconductor chips 20 and 30 together. The bonding layer 32 may be electrically insulated, and thus may be, for example, a non conductive film (NCF). The through via contact 130 included in the first semiconductor chip 20 may be electrically connected to both the package substrate, 10 and the second semiconductor chip 30 to send/receive electric signals to/from the package substrate 10 and the second semiconductor chip 30.

The shape of the semiconductor chip illustrated in FIG. 8 is to explain the usable type of the semiconductor device according to the present invention, and thus is not limited by constituent elements included in the semiconductor package.

Referring to FIGS. 9 to 15, a method for fabricating a semiconductor device according to an embodiment of the present invention will be described.

FIGS. 9 to 15 are cross-sectional views that illustrate intermediate steps of a method for fabricating a semiconductor device according to an embodiment of the present invention.

Figure 9:
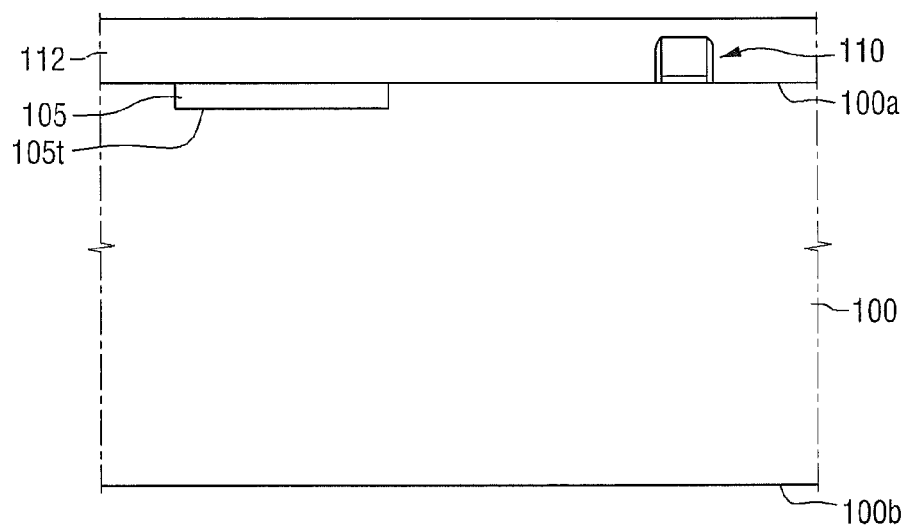
FIGS. 9 to 15 are cross-sectional views illustrating intermediate steps of a method for fabricating a semiconductor device according to embodiments of the present invention.

Referring to FIG. 9, a substrate 100 including a first surface 100a and a second surface 100b which is opposite the first surface 100a is provided. An isolation pattern 105 may be formed on the first surface 100a of the substrate. The isolation pattern 105 may be formed by forming a trench 105 in the first surface 100a of the substrate 100 and then filling the trench 105 with a dielectric layer. A circuit pattern 110 may be formed on the first surface 100a of the substrate 100.

A pre-metal dielectric layer 112 is formed on the first surface 100a of the substrate on which the circuit pattern 110 is formed. The pre-metal dielectric layer 112 may be formed, for example, using a chemical vapor deposition method. The upper surface of the pre-metal dielectric layer 112 may be flat.

Figure 10:
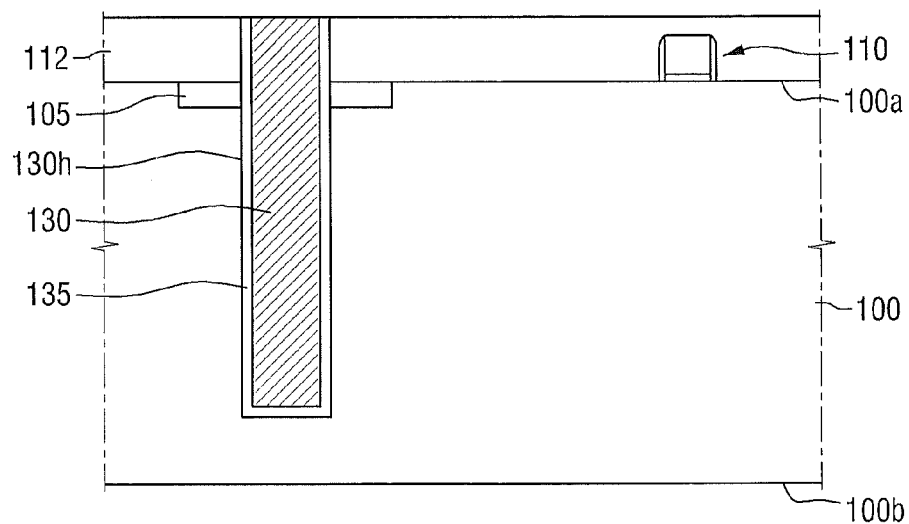

Referring to FIG. 10, a through-hole 130h is formed through the pre-metal dielectric layer 112 and through a portion of the substrate 100. The through-hole 130h is formed to penetrate the isolation pattern 105. A dielectric spacer layer 135 may be uniformly formed on a side surface and a bottom surface of the through-hole 130h, but is not limited thereto. For example, it will be appreciated that the thickness of the dielectric spacer layer 135 that is formed on the side surface and the bottom surface of the through-hole 130h may differ depending on the purpose. By filling the through-hole 130h, in which the dielectric spacer layer 135 is formed, with a conductive material, a through via contact 130 may be formed. The through via contact 130 may be formed, for example, using electroplating or chemical vapor deposition, but is not limited thereto.

Through the above steps, the substrate 100 can be formed that includes a through via contact 130 that extends from the first surface 100a of the substrate 100 and partly through the substrate 100 in a direction normal to the first surface 100a.

Figure 11:
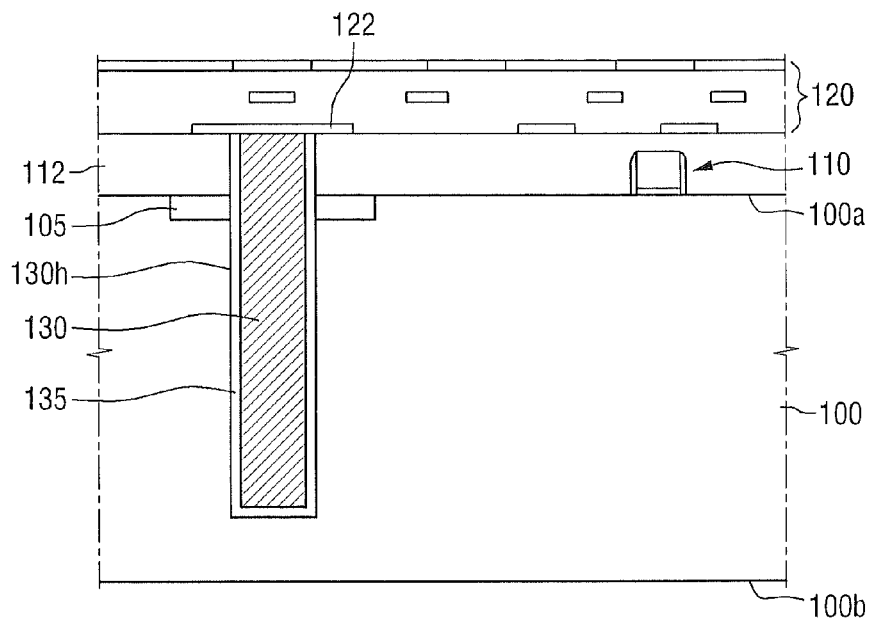

Referring to FIG. 11, a metal wiring layer 120 is formed on the pre-metal dielectric layer 112 on which the through via contact 130 is formed. The metal wiring layer 120 includes a lowermost metal wiring 122 that may be directly formed on the pre-metal dielectric layer 112. A part of the lowermost metal wiring 122 may be connected to the through via contact 130.

Figure 12:
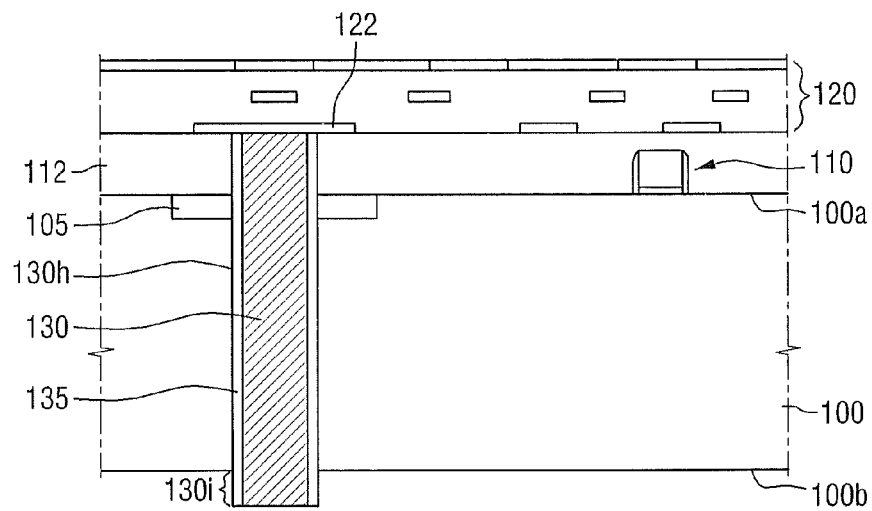

Referring to FIG. 12, a bottom portion of the substrate 100 (i.e., a portion of the substrate adjacent to the bottom surface 100b) may be removed to expose the through via contact 130. The exposed through via contact 130 may project from the new bottom surface 100b of the substrate 100. The bottom portion of the substrate may be removed using, for example, a chemical mechanical polishing (CMP), but is not limited thereto. That is, in combination of a dry etching process and/or a wet etching process combined with chemical mechanical polishing may be used to remove the bottom portion of the substrate.

In the embodiment depicted in FIG. 12, only the bottom portion of the dielectric spacer layer 135 which is on the bottom portion of the exposed through via contact 130 is removed during the process step(s) that are used to remove the bottom portion of the substrate 100. However, it will be appreciated that in other embodiments some or all of the dielectric spacer layer 135 that is formed on the side wall of the exposed through via contact 130 may also be removed. The exposed portion of the through via contact 130 is labeled 130i in FIG. 12.

Figure 13:
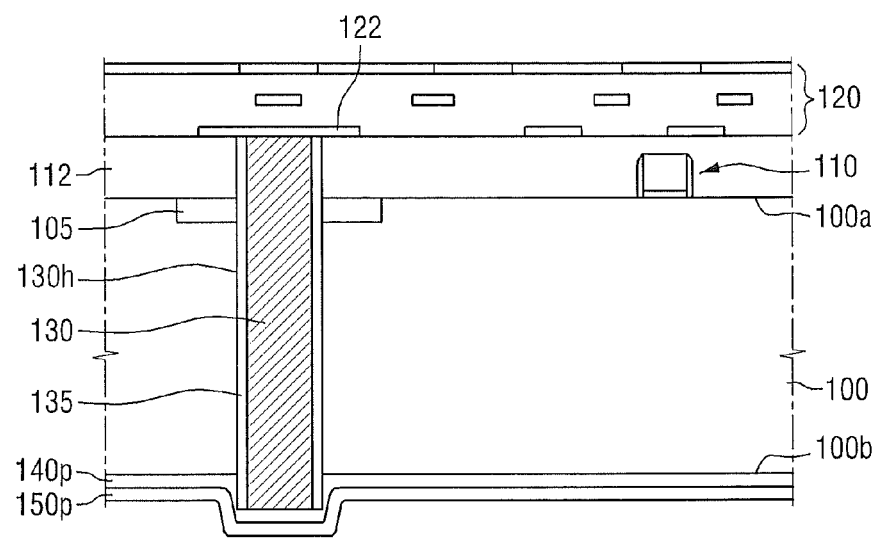

Referring to FIG. 13, a pre-planarization layer 140p and a pre-passivation layer 150p may be sequentially formed to cover the exposed portion 130i of the through via contact 130 and the second surface 100b of the substrate. The pre-planarization layer 140p may include low viscosity resin, and the pre-passivation layer 150p may include at least one of silicon oxide and silicon nitride. The pre-planarization layer 140p may be formed, for example, through a coating method. The pre-passivation layer 150p may be formed, for example, via chemical vapor deposition.

Further, before the pre-planarization layer 140p is formed, a pre-adhesive layer (not shown) may be formed on the exposed through via contact 130 and the second surface 100b of the substrate. The pre-adhesive layer may include at least one of silicon oxide and silicon nitride.

The pre-planarization layer 140p may be cured prior to the formation of the pre-passivation layer 150p. The cure rate of the pre-planarization layer 140p may be, for example, equal to or higher than 83%. Further, the curing temperature of the pre-planarization layer 140p may be, for example, 100° C. to 200° C., but is not limited thereto. The curing time of the pre-planarization layer 140p may be, for example, one hour or less.

Figure 14:
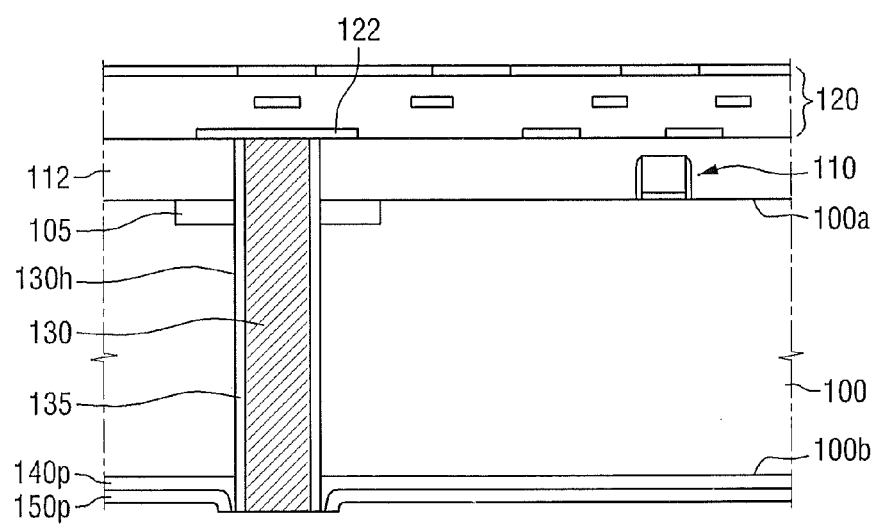

Referring to FIG. 14, a portion of the pre-passivation layer 150p may be removed to expose the through via contact 130. When the part of the pre-passivation layer 150p is removed, a part of the pre-planarization layer 140p may also be removed. The parts of the pre-passivation layer 150p and the pre-planarization layer 140p may be removed, for example, via chemical mechanical polishing.

If the upper surface of the pre-passivation layer 150p is a planar surface when the through via contact 130 is exposed, the chemical mechanical polishing may be interrupted. That is, a passivation layer 150 and a planarization layer 140, which surround the through via contact 130, may be formed.

If the upper surface of the passivation layer 150p is non-planar and step height is formed thereon, the chemical mechanical polishing may be continuously performed.

Figure 15:
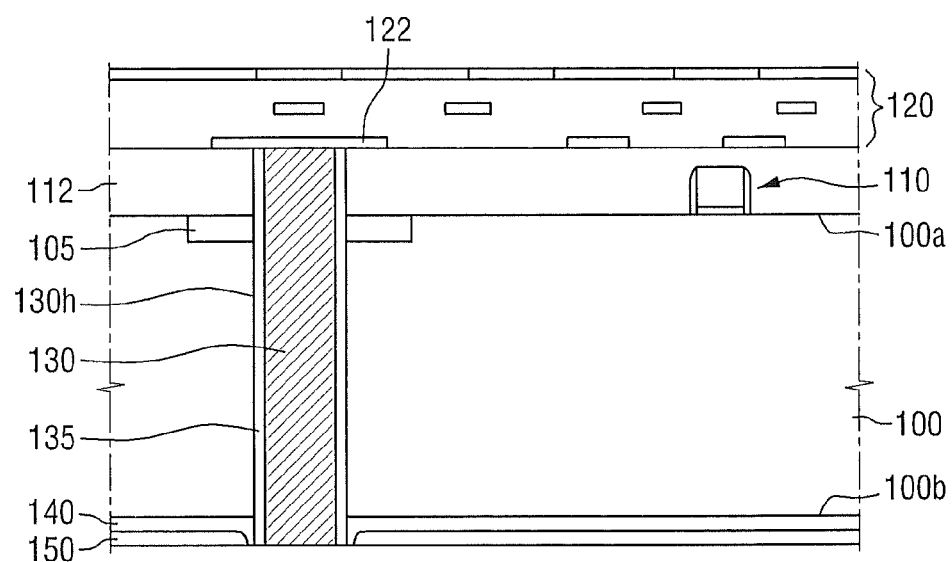

Referring to FIG. 15, part of the exposed through via contact 130 may be removed. This removal step may also planarized the bottom surface of the pre-passivation layer 150 to form the passivation layer 150. This removal process may also remove portions of the pre-passivation layer 140p to form the passivation layer 140. As shown in FIG. 15, a bottom surface of the passivation layer 140 may be planar except for small portions adjacent the through via contact 130.

The upper surface of the passivation layer 150 and the upper surface of the through via contact 130 may be co-planar.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A semiconductor device comprising:
a substrate including a first surface and a second surface that are opposite each other;
a planarization layer on the first surface of the substrate;
a passivation layer on the planarization layer; and
a through via contact penetrating the substrate, the planarization layer, and the passivation layer, an end of the through via contact being exposed through an opening in the passivation layer,
wherein the planarization layer includes low viscosity resin,
wherein the passivation layer includes at least one of silicon oxide and silicon nitride, and
wherein a viscosity of the planarization layer is 100 to 1000 centipoises (CPS).

2. The semiconductor device of claim 1, wherein a surface of the planarization layer that directly contacts the passivation layer includes a first point that is a first distance from the through via contact and a second point that is a second distance from the through via contact, the second distance being greater than the first distance, wherein a first height from the second surface of the substrate to the first point is greater than a second height from the second surface of the substrate to the second point.

3. The semiconductor device of claim 2, wherein a portion of the through via contact projects from the first surface of the substrate, and the planarization layer entirely surrounds a side surface of the portion of the through via contact that projects from the first surface.

4. The semiconductor device of claim 3, wherein the planarization layer includes a recess, and wherein the passivation layer fills the recess.

5. The semiconductor device of claim 1, further comprising an adhesive layer interposed between the first surface of the substrate and the planarization layer.

6. The semiconductor device of claim 5, wherein the adhesive layer includes at least one of silicon oxide and silicon nitride.

7. The semiconductor device of claim 1, further comprising a dielectric spacer layer interposed between the substrate and the through via contact.

8. The semiconductor device of claim 7, wherein a portion of the dielectric spacer layer is exposed through an opening in the passivation layer.

9. The semiconductor device of claim 1, further comprising a pre-metal dielectric layer formed on the second surface of the substrate to cover a circuit pattern formed on the second surface of the substrate, and a metal wiring layer formed on the pre-metal dielectric layer and including a lowermost metal wiring,
wherein the through via contact penetrates the pre-metal dielectric layer and is connected to the lowermost metal wiring.

10. A semiconductor device comprising:
a substrate including a first surface and a second surface that are opposite each other;
an isolation pattern on the first surface of the substrate;
a circuit pattern on the first surface of the substrate;
a pre-metal dielectric layer on the first surface of the substrate that at least partly covers the circuit pattern;
a through-hole penetrating the pre-metal dielectric layer, the substrate and the isolation pattern;
a through via contact in the through-hole, wherein a portion of the through via contact projects from the second surface of the substrate;
a dielectric spacer layer between the substrate and the through via contact;
a planarization layer on the dielectric spacer layer and the second surface of the substrate, the planarization layer including a first opening that exposes the through via contact; and
a passivation layer on the planarization layer, the passivation layer including a second opening that exposes the through via contact.

11. The semiconductor device of claim 10, wherein the planarization layer includes low viscosity resin, and the passivation layer includes at least one of silicon oxide and silicon nitride.

12. The semiconductor device of claim 10, wherein the dielectric spacer layer is only on a side wall of the through-hole.

13. The semiconductor device of claim 10, further comprising a metal wiring layer on the pre-metal dielectric layer, wherein the metal wiring layer includes a lowermost metal wiring, and the through via contact is connected to the lowermost metal wiring.

14. The semiconductor device of claim 10, further comprising an adhesive layer between the substrate and the planarization layer,
wherein the adhesive layer includes at least one of silicon oxide and silicon nitride.

15. A semiconductor device, comprising:
a substrate having a first major surface and a second major surface opposite the first surface;
a plurality of through-holes that each extend through the substrate from the first major surface to the second major surface;
a plurality of through via contacts that are positioned in respective ones of the plurality of through-holes, wherein a first end of each through via contact projects from the second major surface of the substrate;
a planarization layer on the second major surface of the substrate; and
a passivation layer on the planarization layer opposite the substrate, the passivation layer being coplanar with the first end of each through via contact,
wherein the planarization layer includes low viscosity resin,
wherein the passivation layer includes at least one of silicon oxide and silicon nitride, and
wherein a viscosity of the planarization layer is 100 to 1000 centipoises (CPS).

16. The semiconductor device of claim 15, wherein the second major surface of the substrate is uneven.

17. The semiconductor device of claim 16, wherein the planarization layer extends at least between a first one of the plurality of through via contacts and a second one of the plurality of through via contacts, and wherein the portion of the planarization layer that is between the first and second ones of the plurality of through via contacts has a planar top surface at least in a middle section between the first and second ones of the plurality of through via contacts.

18. The semiconductor device of claim 15, wherein the planarization layer includes recesses that are filled by the passivation layer.

19. The semiconductor device of claim 18, wherein middle portions of the bottom surfaces of the recesses are planar surfaces.

* * * * *